US011152510B2

(12) United States Patent
Zhang et al.

(10) Patent No.: US 11,152,510 B2
(45) Date of Patent: Oct. 19, 2021

(54) LONG CHANNEL OPTIMIZATION FOR GATE-ALL-AROUND TRANSISTORS

(71) Applicant: International Business Machines Corporation, Armonk, NY (US)

(72) Inventors: Jingyun Zhang, Albany, NY (US); Takashi Ando, Tuckahoe, NY (US); Choonghyun Lee, Rensselaer, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 16/045,222

(22) Filed: Jul. 25, 2018

(65) Prior Publication Data
US 2020/0035820 A1 Jan. 30, 2020

(51) Int. Cl.
*H01L 29/78* (2006.01)
*H01L 29/10* (2006.01)
(Continued)

(52) U.S. Cl.
CPC ........ *H01L 29/785* (2013.01); *H01L 29/1033* (2013.01); *H01L 29/41791* (2013.01); *H01L 29/66795* (2013.01); *H01L 2029/7858* (2013.01)

(58) Field of Classification Search
CPC ......... H01L 29/42392; H01L 29/78696; H01L 29/0673; H01L 21/02532; H01L 29/66545;
(Continued)

(56) References Cited

U.S. PATENT DOCUMENTS 7,700,993 B2 4/2010 Cai et al.
8,835,191 B2 9/2014 Bryant et al.
(Continued)

FOREIGN PATENT DOCUMENTS

JP 3499859 B2 2/2004
TW 201742150 A 12/2017
WO 2017111848 A1 6/2017

OTHER PUBLICATIONS

Chang, Y. J., "Junction-LevelHeterogeneous Integration of III-V Materials with Si CMOS for Novel Asymmetric Field-Effect Transistors", Doctoral dissertation, Jan. 1, 2016, 176 pages, UCLA.
(Continued)

*Primary Examiner* — Mark W Tornow
*Assistant Examiner* — Priya M Rampersaud
(74) *Attorney, Agent, or Firm* — Scully, Scott, Murphy & Presser, P.C.; L. Jeffrey Kelly, Esq.

(57) ABSTRACT

A strained relaxed silicon germanium alloy buffer layer is employed in the present application to induce a tensile stain on each suspended semiconductor channel material nanosheet within a nanosheet material stack that is present in a long channel device region of a semiconductor substrate. The induced tensile strain keeps the suspended semiconductor channel material nanosheets that are present in long channel device region essentially straight in a lateral direction. Hence, reducing and even eliminating the sagging effect that can be caused by surface tension.

10 Claims, 9 Drawing Sheets

(51) Int. Cl.
    *H01L 29/66* (2006.01)
    *H01L 29/417* (2006.01)

(58) Field of Classification Search
    CPC ... H01L 29/785; H01L 29/1054; H01L 29/16; H01L 29/165; H01L 29/66439; H01L 21/823821; H01L 21/845; H01L 27/0924; H01L 27/1211; H01L 29/161; H01L 29/66795; H01L 21/02381; H01L 21/02603; H01L 21/823412; H01L 29/20; H01L 29/78618; H01L 21/84; H01L 29/0847; H01L 29/66772; H01L 21/02164; H01L 21/0245; H01L 21/30604; H01L 27/092; H01L 27/0922; H01L 21/02236; H01L 29/045; H01L 29/0665; H01L 29/401; H01L 29/66553; H01L 29/7848; H01L 29/78684; H01L 2029/7858; H01L 21/02255; H01L 21/7624; H01L 21/823431; H01L 29/0653; H01L 29/0676; H01L 29/78; H01L 29/78654; H01L 21/02664; H01L 21/02694; H01L 21/3065; H01L 21/31111; H01L 21/324; H01L 21/76251; H01L 21/823885; H01L 21/8258; H01L 27/1207; H01L 29/205; H01L 29/6653; H01L 29/6656; H01L 29/7853; H01L 29/78681; H01L 29/78687; H01L 21/02378; H01L 21/0251; H01L 21/02538; H01L 21/02546; H01L 21/02667; H01L 21/26513; H01L 21/3083; H01L 21/3086; H01L 21/3105; H01L 21/76224; H01L 21/76254; H01L 21/76256; H01L 21/76283; H01L 21/764; H01L 21/823437; H01L 21/823814; H01L 21/823878; H01L 27/0886; H01L 27/1203; H01L 29/0649; H01L 29/0669; H01L 29/1033; H01L 29/24; H01L 29/42356; H01L 29/42384; H01L 29/45; H01L 29/66469; H01L 29/665; H01L 29/66636; H01L 29/6681; H01L 29/7827; H01L 29/7842; H01L 29/7845; H01L 29/7849; H01L 29/78603; H01L 29/78642; H01L 29/78651; H01L 2029/42388; H01L 21/02; H01L 21/0206; H01L 21/0217; H01L 21/02238; H01L 21/02271; H01L 21/0228; H01L 21/02499; H01L 21/02502; H01L 21/02505; H01L 21/0254; H01L 21/02543; H01L 21/02584; H01L 21/02609; H01L 21/0262; H01L 21/02636; H01L 21/2236; H01L 21/2254; H01L 21/2255; H01L 21/26506; H01L 21/266; H01L 21/283; H01L 21/28512; H01L 21/28518; H01L 21/28568; H01L 21/30608; H01L 21/30612; H01L 21/3081; H01L 21/31116; H01L 21/31144; H01L 21/31155; H01L 21/31604; H01L 21/31658; H01L 21/3215; H01L 21/76243; H01L 21/76264; H01L 21/76843; H01L 21/76855; H01L 21/823418; H01L 21/823462; H01L 21/823481; H01L 21/823828; H01L 21/823857; H01L 21/823871; H01L 21/8252; H01L 21/8256; H01L 27/0605; H01L 27/0629; H01L 27/0688; H01L 27/088; H01L 29/1037; H01L 29/1079; H01L 29/12; H01L 29/1608; H01L 29/2003; H01L 29/41725; H01L 29/42332; H01L 29/42364; H01L 29/42376; H01L 29/456; H01L 29/495; H01L 29/4958; H01L 29/4966; H01L 29/4975; H01L 29/51; H01L 29/513; H01L 29/517; H01L 29/66; H01L 29/66431; H01L 29/66462; H01L 29/66477; H01L 29/66484; H01L 29/66522; H01L 29/6659; H01L 29/66651; H01L 29/66666; H01L 29/66787; H01L 29/66818; H01L 29/66893; H01L 29/66916; H01L 29/66977; H01L 29/7391; H01L 29/7786; H01L 29/7831; H01L 29/7838; H01L 29/7851; H01L 29/7855; H01L 29/802; H01L 29/41791; H01L 29/775; H01L 21/78618; H01L 21/823456; H01L 29/41766; Y10S 438/933; Y10S 438/938; B82Y 10/00
    See application file for complete search history.

(56) References Cited

U.S. PATENT DOCUMENTS

| | | | |
|---|---|---|---|
| 8,987,794 B2* | 3/2015 | Rachmady | H01L 29/045 257/288 |
| 9,685,564 B2 | 6/2017 | Sengupta et al. | |
| 9,842,777 B2 | 12/2017 | Witters et al. | |
| 9,922,942 B2 | 3/2018 | Balakrishnan et al. | |
| 2009/0230463 A1* | 9/2009 | Carter | H01L 21/28114 257/327 |
| 2014/0225065 A1* | 8/2014 | Rachmady | H01L 29/7851 257/24 |
| 2015/0333167 A1* | 11/2015 | Leobandung | H01L 21/02532 257/347 |
| 2016/0111335 A1* | 4/2016 | Brunco | H01L 21/26513 438/218 |
| 2017/0141207 A1* | 5/2017 | Cheng | H01L 29/0653 |
| 2018/0233572 A1* | 8/2018 | Cheng | H01L 29/4238 |
| 2018/0301564 A1* | 10/2018 | Kwon | H01L 29/0673 |
| 2019/0305135 A1* | 10/2019 | Radosavljevic | H01L 21/02603 |

OTHER PUBLICATIONS

Anonymous, "Partially Suspended Nanowire with a Tensile Channel Stressor", Oct. 25, 2013, 2 pages.

Lee, K. H., et al., "Hetero-epitaxy of high quality germanium film on silicon substrate for optoelectronic integrated circuit applications", Journal of Materials Research, Jul. 2017, pp. 4025-4040, 32(21).

Di, Z., et al., "Strain relaxation mechanism in SiGe-on-insulator fabricated by Ge condensation", Journal of Crystal Growth, Available online May 25, 2005, pp. 275-280, 281.

Hashemi, P., et al., "Advanced Strained-Silicon and Core-Shell Si/Si1—xGex Nanowires for CMOS Transport Enhancement", ECS Transactions, Oct. 19, 2010, pp. 687-698, 33 (6).

* cited by examiner

LONG CHANNEL OPTIMIZATION FOR GATE-ALL-AROUND TRANSISTORS

BACKGROUND

The present application relates to a semiconductor structure and a method of forming the same. More particularly, the present application relates to a semiconductor structure including a gate-all-around transistor that reduces long channel device sagging in order to enable I/O devices.

The use of non-planar semiconductor devices such as, for example, nanosheet containing devices has been touted as a viable option for the 5 nm or beyond technology node. By "nanosheet containing device" it is meant that the device contains one or more layers of semiconductor channel material portions having a vertical thickness that is substantially less than its width. Nanosheet formation relies on the selective removal of one semiconductor material relative to another semiconductor material to form suspended nanosheets for gate-all-around transistors.

Gate-all-around transistors including semiconductor channel material nanosheets can provide better electrostatic control in order to meet the requirement for further aggressive device scaling. Such gate-all-around transistors including a long channel are important for I/O devices. However, sagging issues caused by surface tension have been observed for such gate-all-around transistors which may potentially reduce the effective channel area, degrade gate control and/or increase threshold voltage reliability. There is thus a need for providing a semiconductor structure including a gate-all-around transistor in which the sagging effect has been reduced in order to optimize long channel device behavior.

SUMMARY

A strained relaxed silicon germanium alloy buffer layer is employed in the present application to induce a tensile stain on each suspended semiconductor channel material nanosheet within a nanosheet material stack that is present in a long channel device region of a semiconductor substrate. The induced tensile strain keeps the suspended semiconductor channel material nanosheets that are present in long channel device region essentially straight in a lateral direction. Hence, reducing and even eliminating the sagging effect that can be caused by surface tension.

In one aspect of the present application, a semiconductor structure is provided. In one embodiment, the semiconductor structure includes a plurality of stacked and suspended semiconductor channel material nanosheets located above a strained relaxed silicon germanium alloy buffer layer and in a long channel device region. Each suspended semiconductor channel material nanosheet is tensilely strained. A functional gate structure wraps around a portion of each semiconductor channel material nanosheet of the plurality of stacked and suspended semiconductor channel material nanosheets, and a source/drain (S/D) structure is present on each side of the functional gate structure and physically contacting sidewalls of each semiconductor channel material nanosheet of the plurality of stacked and suspended semiconductor channel material nanosheets.

In another aspect of the present application, a method of forming a semiconductor structure is provided. In one embodiment, the method includes providing a semiconductor material stack structure of alternating layers of a sacrificial semiconductor material and a semiconductor channel material on a strained relaxed silicon germanium buffer layer and in a long channel device region. Each layer of semiconductor channel material is tensilely strained. A sacrificial gate structure and a dielectric material spacer are formed on a surface of the semiconductor material stack structure. The semiconductor material stack structure not covered by the sacrificial gate structure and dielectric material spacer are removed to provide a nanosheet material stack of alternating nanosheets of the sacrificial semiconductor material and the semiconductor channel material beneath the sacrificial gate structure and the dielectric material spacer. Each sacrificial semiconductor material nanosheet of the nanosheet material stack is recessed to provide a gap above and beneath each semiconductor channel material nanosheet. An inner dielectric spacer is then formed in each gap. A source/drain structure is formed from physically exposed sidewalls of each semiconductor channel material nanosheet. The sacrificial gate structure and each recessed sacrificial semiconductor material nanosheet of the nanosheet material stack are then removed to provide a gate cavity and suspend each semiconductor channel material nanosheet, and thereafter a functional gate structure is formed in the gate cavity and wrapping around a portion of each suspended semiconductor channel material nanosheet.

DETAILED DESCRIPTION

Figure 1:
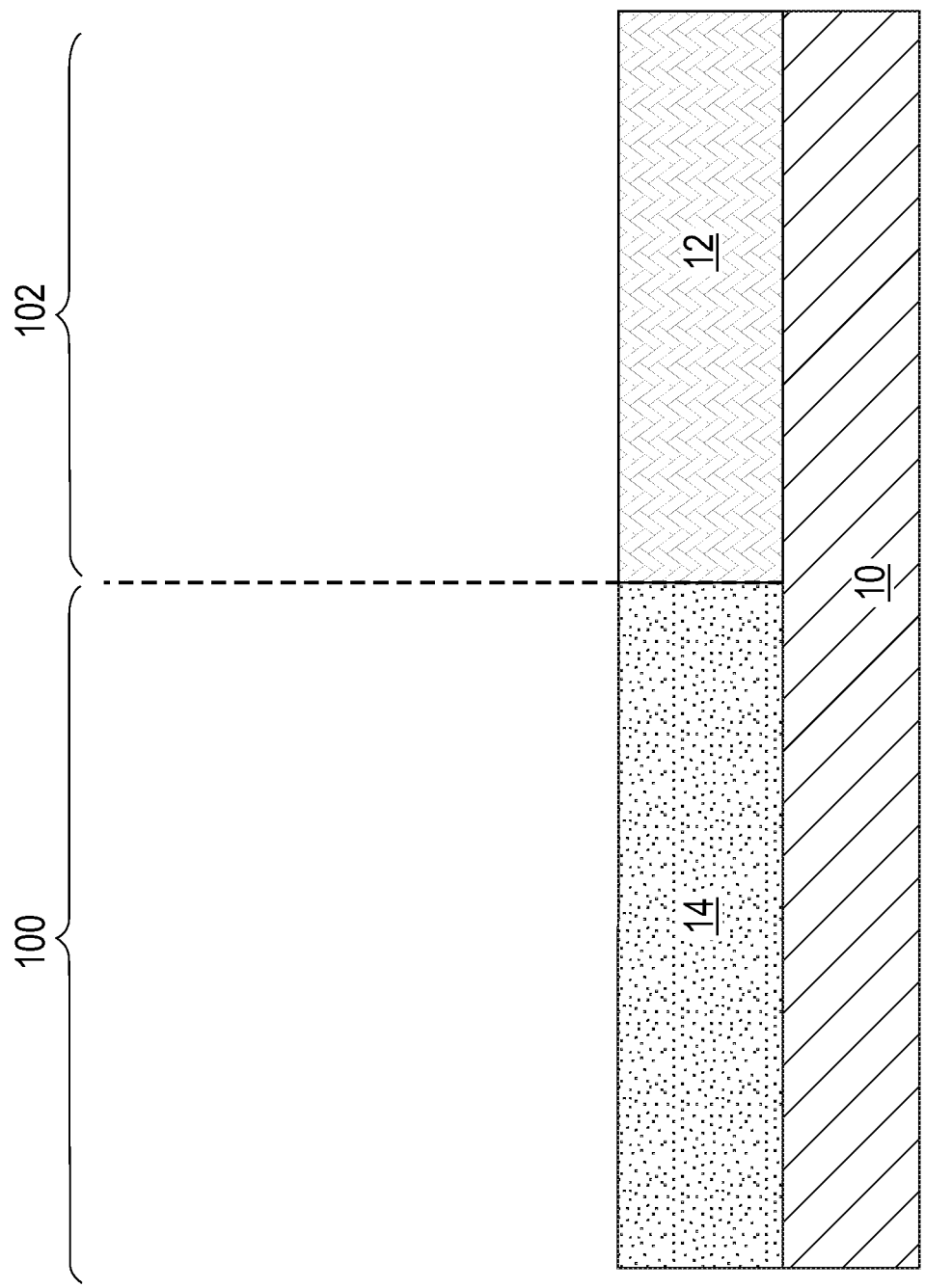
FIG. 1 is a cross sectional view of an exemplary semiconductor structure of the present application during an early stage of fabrication and including a substrate containing an insulator layer and having a long channel device region and a short channel device region, wherein a strained relaxed silicon germanium alloy buffer layer is present in the long channel device region and a silicon layer is present in the short channel device region.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure of the present application during an early stage of fabrication and including a substrate containing an insulator layer 10 and having a long channel device region 100 and a short channel device region 102, wherein a strained relaxed silicon germanium alloy buffer layer 14 is present in the long channel device region 100 and a silicon layer 12 is present in the short channel device region 102. In some embodiments of the present application, the short channel device region 102 can be omitted.

The long channel device region 100 is laterally adjacent to the short channel device region 102. In some embodiments, the long channel device region 100 may be located immediately adjacent to the short channel device region 102. In other embodiments, a gap may be present between the long channel device region 100 and the short channel device region 102.

The term "long channel device region" is used throughout the present application to denote a device region in which the device channel is greater than 100 nm. In some embodiments, the device channel within the long channel device region 100 may be from 110 nm to 300 nm. The term "short channel device region" is used throughout the present application to denote a device region in which the device channel is from 100 nm or less. In some embodiments, the device channel within the short channel region 102 is from 10 nm to 50 nm.

The insulator layer 10 that can be employed in the present application may be a crystalline or non-crystalline dielectric material. In one example, the insulator layer 10 may be composed of silicon dioxide and/or boron nitride. In some embodiments, the insulator layer 10 is a component of a silicon-on-insulator (SOI) substrate that includes a handle substrate (not shown) present directly beneath the insulator layer 10, a silicon layer (a portion of which is silicon layer 12) is present directly above the insulator layer 12. The insulator layer 10 may have a thickness from 10 nm to 200 nm. Other thicknesses are however possible for the thickness of the insulator layer 10 and thus are not excluded from being used in the present application.

The silicon layer 12 is typically a crystalline semiconductor material that may represent a topmost semiconductor layer of an SOI substrate that includes the insulator layer 10. The silicon layer 12 may have a thickness from 1.5 nm to 20 nm. Other thicknesses are however possible for the thickness of the silicon layer 12 and thus are not excluded from being used in the present application.

The strained relaxed silicon germanium alloy buffer layer 14 is composed of a silicon germanium alloy that has a germanium content from 15 atomic percent to 35 atomic percent. The term "strained relaxed silicon germanium alloy buffer layer" is used throughout the present application to denote a silicon germanium alloy layer that is relaxed without strain. The strained relaxed silicon germanium alloy buffer layer 14 may have a strain value of 0.1% or less. The strained relaxed silicon germanium alloy buffer layer 14 may have a thickness that is the same as, or different from, the thickness of the silicon layer 12.

The exemplary semiconductor structure shown in FIG. 1 can be formed by providing an SOI substrate that includes a topmost silicon layer. The silicon layer within the long channel device region 100 can be recessed utilizing an etching process that is selective in removing silicon. A block mask is formed over the silicon layer in the short channel device region 102 prior to the recess etch; the protected silicon layer in the short channel device region serves as silicon layer 12 of the exemplary structure shown in FIG. 1.

A relaxed silicon germanium alloy layer (not show) is then formed on the recessed silicon layer in the long channel device region 100. The relaxed silicon germanium alloy layer may be formed utilizing an epitaxial growth (or deposition) process; the block mask is present on the silicon layer in the short channel device region 102 during the epitaxial growth process.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the relaxed silicon germanium alloy layer thus has an epitaxial relationship with the surface of the recessed silicon layer in the long channel device region 100.

Examples of various epitaxial growth process apparatuses that are suitable for use in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

A number of different sources may be used for the deposition of the relaxed silicon germanium alloy layer. In some embodiments, the source gas for the deposition the relaxed silicon germanium alloy layer may include an admixture of a silicon containing gas source and a germanium containing gas source. Examples of silicon gas sources include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium gas sources include germane, digermane, halogermane, dichlorogermane, trichlorogermane, tetrachlorogermane and combinations thereof. In some embodiments, the relaxed silicon germanium alloy layer can be formed from a source gas that includes a compound containing silicon and germanium. Other source gases or gases mixtures that are known to those skilled in the art can also be used in forming the relaxed silicon germanium alloy layer. Carrier gases like hydrogen, nitrogen, helium and argon can be used.

The relaxed silicon germanium alloy layer that is epitaxially grown has a germanium content that is typically from 15 atomic percent to 35 atomic percent. The relaxed silicon germanium alloy layer may have a strain value of 0.1% or less. The relaxed silicon germanium alloy layer may have that a thickness from 20 nm to 40 nm.

A germanium (Ge) condensation anneal (i.e., thermal oxidation) is used to convert the recessed silicon layer and the relaxed silicon germanium alloy layer into the strained relaxed silicon germanium alloy layer 14. During the condensation anneal, Si atoms in the relaxed silicon germanium alloy layer react with oxygen forming a surface silicon oxide layer (not shown) and Ge atoms from the relaxed silicon germanium alloy layer diffuse into the recessed silicon layer and react with Si to form the strained silicon germanium alloy layer 14. The Ge condensation anneal can be performed in an oxidizing ambient such as, for example, oxygen, air, ozone, water vapor, and/or $NO_2$. In some embodiments, the oxidizing ambient can be admixed with an inert gas such as, for example, He, Ar and/or Ne. In such an embodiment, the inert gas constituent from 2 volume % to 95 volume % of an oxidizing ambient containing admixture. The Ge condensation anneal can be performed at a temperature from 400° C. to 1200° C. The Ge condensation anneal may include a furnace anneal, or a rapid thermal anneal. The surface oxide layer that is formed, together with the block mask can be removed providing the structure shown in FIG. 1.

Figure 2:
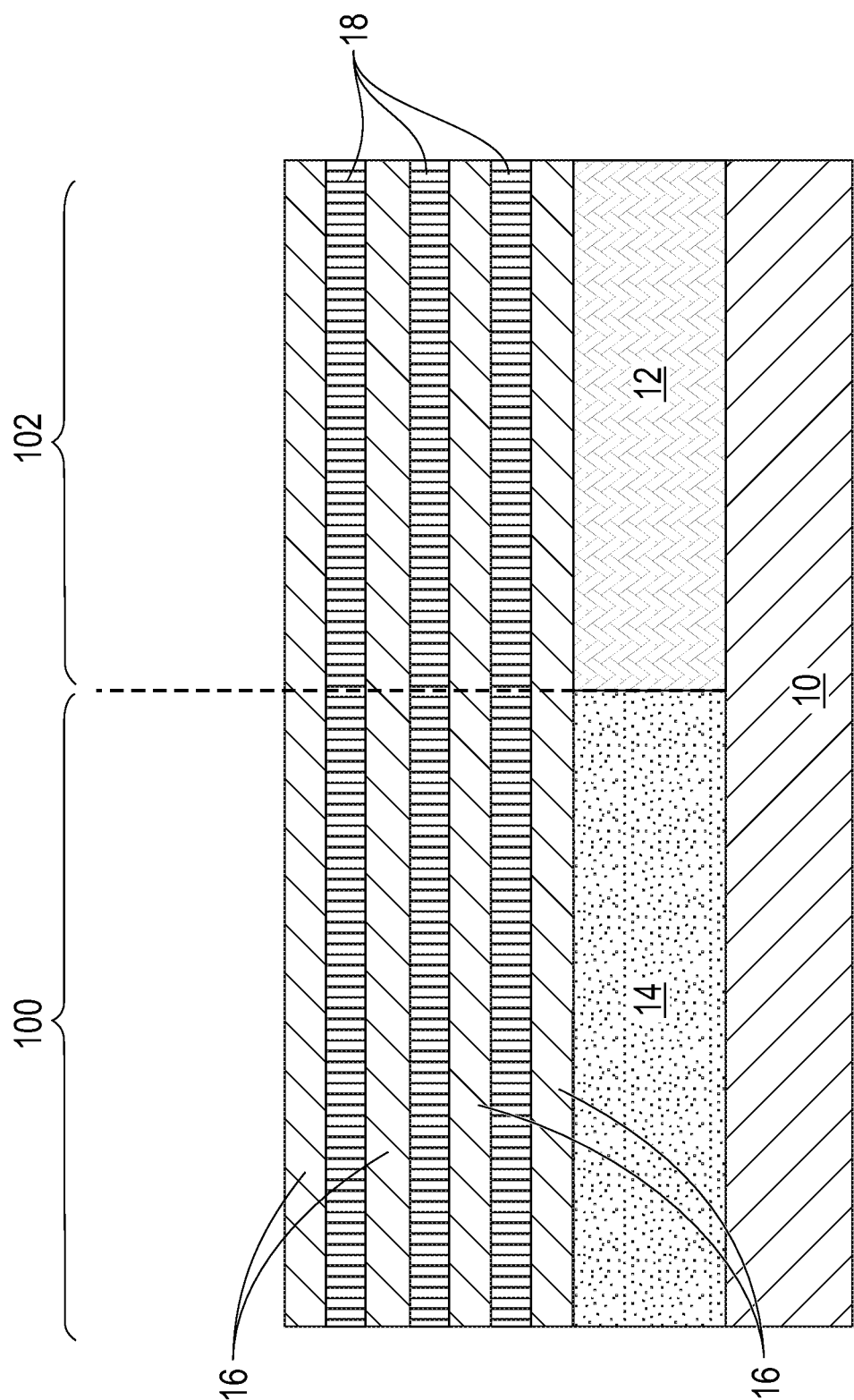
FIG. 2 is a cross sectional view of the exemplary semiconductor structure of FIG. 1 after forming a semiconductor material stack structure of alternating layers of a sacrificial semiconductor material and a semiconductor channel material in both the long channel device region and the short channel device region.

Referring now to FIG. 2, there is illustrated the exemplary semiconductor structure of FIG. 1 after forming a semiconductor material stack structure of alternating layers of a sacrificial semiconductor material 16 and a semiconductor channel material 18 in both the long channel device region 100 and the short channel device region 102. Although a single semiconductor material stack structure is described and illustrated, a plurality of semiconductor material stack structures each containing a vertical stack of alternating layers of a sacrificial semiconductor material 16 and a semiconductor channel material 18 can be formed. In such an embodiment, each semiconductor material stack structure is orientated parallel to one another.

The formation of the semiconductor material stack structure includes forming a semiconductor material stack on the strained relaxed silicon germanium alloy layer 14 and the silicon layer 12 and then patterning the semiconductor material stack to form the semiconductor material stack structure. Patterning may be performed by lithography and etching or any other patterning method known to those skilled in the art including, for example, a sidewall-image transfer (SIT) process.

The term "semiconductor material stack structure" denotes a continuous structure including a pair of vertical sidewalls that are parallel to each other. As used herein, a surface is "vertical" if there exists a vertical plane from which the surface does not deviate by more than three times the root mean square roughness of the surface. The semiconductor material stack structure may have a height from 50 nm to 200 nm, a width from 30 nm to 200 nm, and a length from 100 nm to 2000 nm. Other heights and/or widths and/or lengths may also be used as the dimensions of the semiconductor material stack structure.

The semiconductor material stack that is employed in forming the semiconductor material stack structure is composed of alternating layers of the sacrificial semiconductor material 16 and the semiconductor channel material 18; the alternating layers of the sacrificial semiconductor material 16 and the semiconductor channel material 18 are also present in the semiconductor material stack structure. In the present application, the semiconductor material stack includes at least 2n layers of semiconductor channel material 18 (wherein n is an integer of greater than, or equal, to 1), and 2n+1 layers of sacrificial semiconductor material 16, and each layer of semiconductor channel material 18 is located between a lower layer of sacrificial semiconductor material 16 and an upper layer of sacrificial semiconductor material 16. In one example, the semiconductor material stack includes four layers of sacrificial semiconductor material 16 and three layers of semiconductor channel material 18.

Each layer of sacrificial semiconductor material 16 is composed of a semiconductor material which differs in composition from the strained relaxed silicon germanium alloy buffer layer and the silicon layer 12. In one embodiment, each layer of sacrificial semiconductor material 26 is composed of a silicon germanium alloy that has a greater germanium content than the strained relaxed silicon germanium alloy buffer layer 14. Each layer of sacrificial semiconductor material 18 can be formed utilizing an epitaxial growth (or deposition process), as defined above.

Each layer of semiconductor channel material 18 is composed of a semiconductor material that has a different etch rate than the semiconductor material that provides each layer of sacrificial semiconductor material 16. In one example, each layer of semiconductor channel material 18 is composed of silicon or a III-V compound semiconductor, while each layer of sacrificial semiconductor material 16 is composed of a silicon germanium alloy having a different germanium content than the strained relaxed silicon germanium buffer layer 14. Each layer of semiconductor channel material 18 can be formed utilizing an epitaxial growth (or deposition process) as defined above.

Each layer of sacrificial semiconductor material 16 may have a thickness from 5 nm to 12 nm, while each layer of semiconductor channel material 18 may have a thickness from 5 nm to 12 nm. Each layer of sacrificial semiconductor material 16 may have a thickness that is the same as, or different from, a thickness of each layer of semiconductor channel material 18. Due to the presence of the silicon germanium alloy buffer layer 14, the semiconductor channel material 18 in the long channel region 100 is tensilely strained; the semiconductor channel material 18 in the short channel region 102 may be unstrained.

Figure 3:
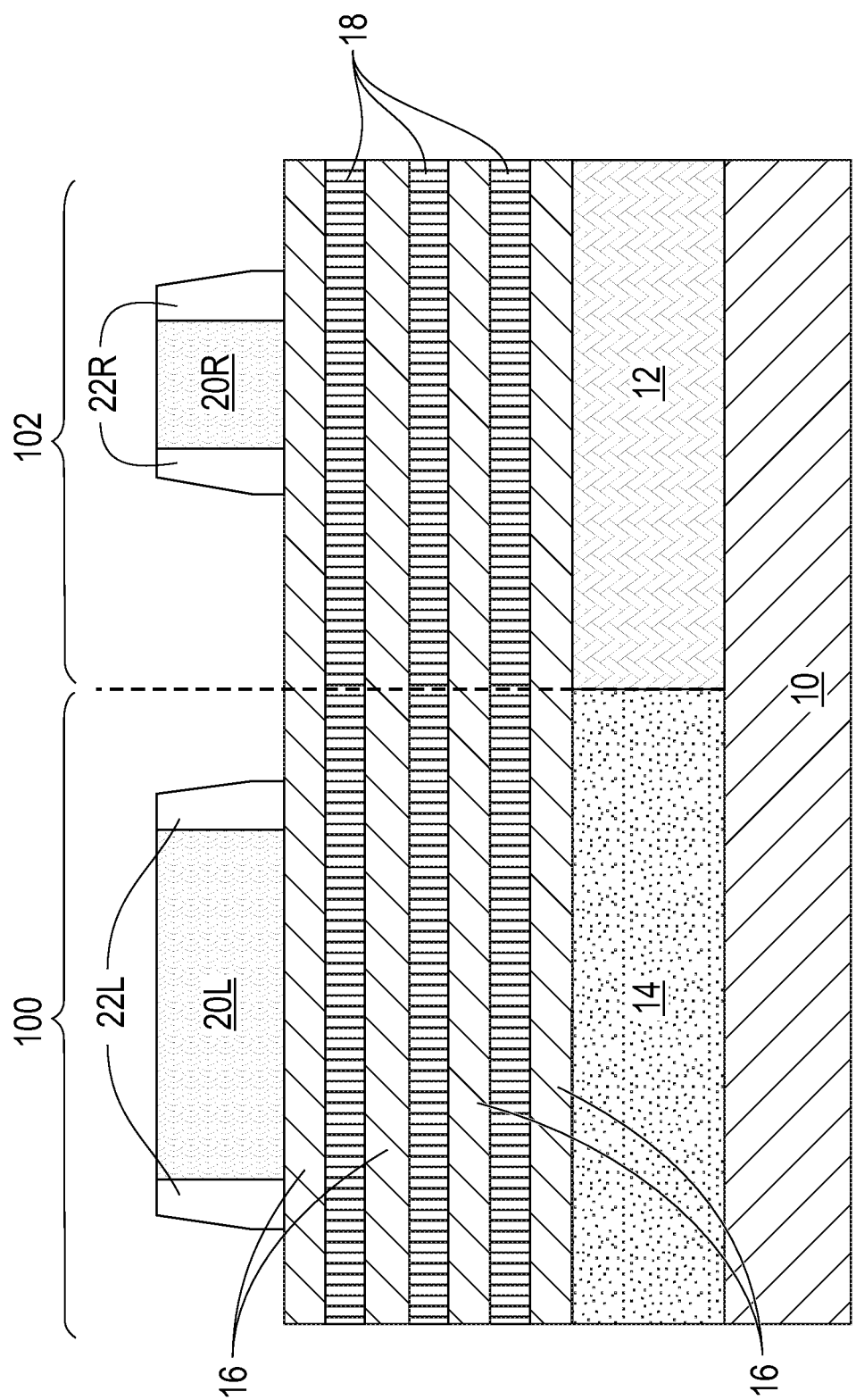
FIG. 3 is a cross sectional view of the exemplary semiconductor structure of FIG. 2 after forming a first sacrificial gate structure and a first dielectric material spacer on a first surface of the semiconductor material stack structure in the long channel device region, and a second sacrificial gate structure and a second dielectric material spacer on a second surface of the semiconductor material stack structure in the short channel device region.

Referring now to FIG. 3, there is illustrated the exemplary semiconductor structure of FIG. 2 after forming a first sacrificial gate structure 20L and a first dielectric material spacer 22L on a first surface of the semiconductor material stack structure (16/18) in the long channel device region 100, and a second sacrificial gate structure 20R and a second dielectric material spacer 22R on a second surface of the semiconductor material stack structure (16/18) in the short channel device region 102.

The first and sacrificial gate structures (20L, 20R) are located on a first side and a second side of the semiconductor material stack structure and spans across a topmost surface of a portion of the semiconductor material stack structure. The first and second sacrificial gate stack structures (20L, 20R) thus straddle over a portion of the semiconductor material stack structure. The first and second sacrificial gate structures (20L, 20R) may include a single sacrificial material or a stack of two or more sacrificial materials (i.e., first and second sacrificial gate structures (20L, 20R) includes at least one sacrificial material). In one embodiment, the at least one sacrificial material comprises, from bottom to top, a sacrificial gate dielectric material, a sacrificial gate material and a sacrificial dielectric cap. In some embodiments, the sacrificial gate dielectric material and/or the sacrificial dielectric cap can be omitted and only a sacrificial gate material is formed. The at least one sacrificial material can be formed by forming a blanket layer (or layers) of a material (or various materials) and then patterning the material (or various materials) by lithography and an etch. In one embodiment, the at least one sacrificial material can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the first and second sacrificial gate structures (20L, 20R). As is shown, the first sacrificial gate structure 20L has a longer width that the second sacrificial gate structure 20R. In one example, the first sacrificial gate structure 20L has a width greater than 100 nm, while the second sacrificial gate structure 20R has a width of 100 nm or less. In some embodiments, the first sacrificial gate structure 20L may be from 110 nm to 300 nm, while the second sacrificial gate structure 20R may have a width from 10 nm to 50 nm.

The first and second dielectric material spacers (22L, 22R) can be formed by deposition of a dielectric spacer material and then etching the dielectric spacer material. One example of a dielectric spacer material that may be employed in the present application is silicon nitride. The deposition process that can be employed in providing the dielectric spacer material includes, for example, chemical vapor deposition (CVD), plasma enhanced chemical vapor deposition (PECVD), or physical vapor deposition (PVD). The etch used to etch the deposited dielectric spacer material may comprise a dry etching process such as, for example, reactive ion etching.

Figure 4:
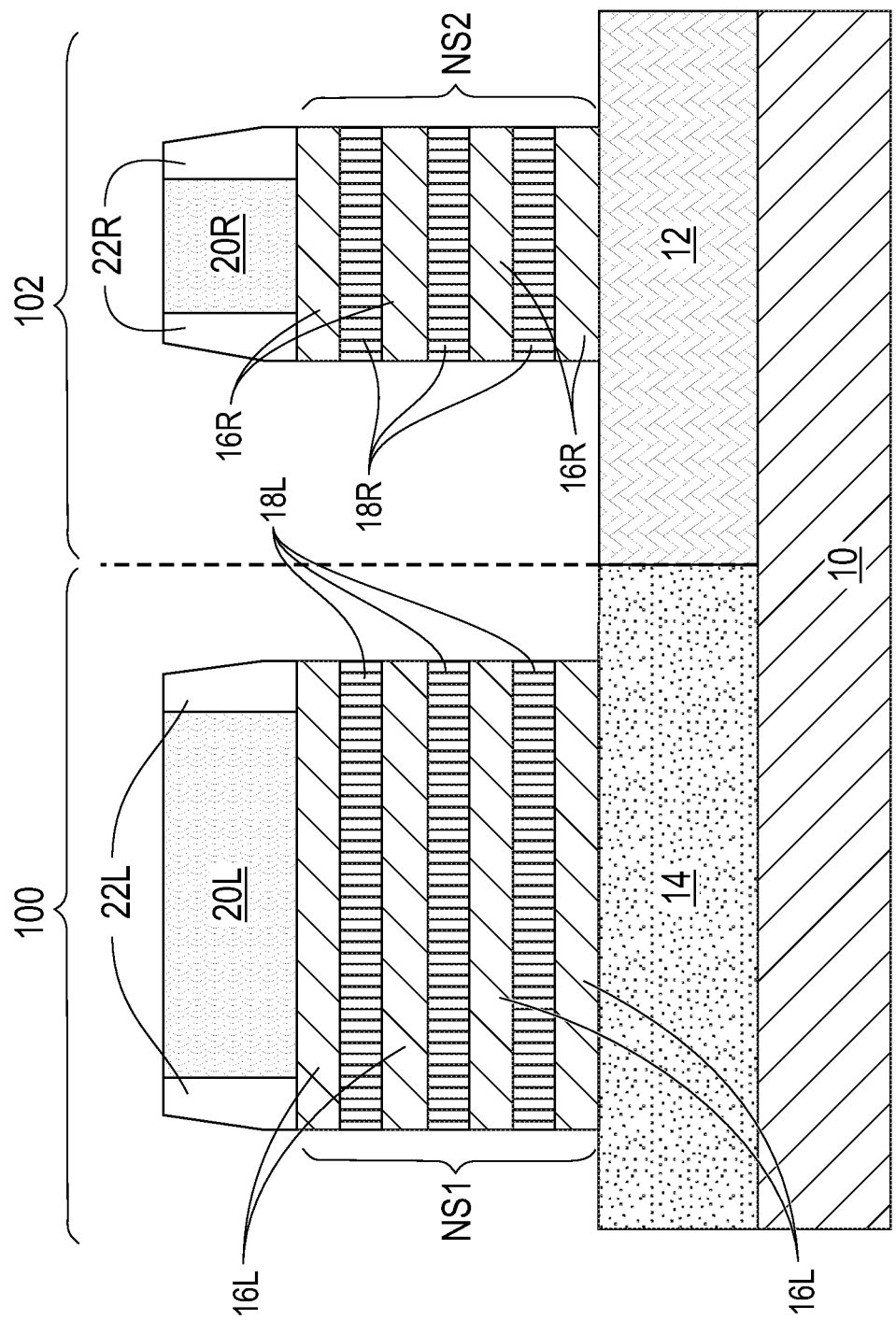
FIG. 4 is a cross sectional view of the exemplary semiconductor structure of FIG. 3 after removing physically exposed portions of the semiconductor material stack structure that are not protected by first and second sacrificial gate structures and the first and second dielectric material spacers to provide a first nanosheet material stack located beneath the first sacrificial gate structure and the first dielectric material spacer, and a second nanosheet material stack located beneath the second sacrificial gate structure and the second dielectric material spacer.

Referring now to FIG. 4, there is illustrated the exemplary semiconductor structure of FIG. 3 after removing physically exposed portions of the semiconductor material stack structure (16/18) that are not protected by first and second sacrificial gate structures (20L, 20R) and the first and second dielectric material spacers (22L, 22R) to provide a first nanosheet material stack, NS1, located beneath the first sacrificial gate structure 20L and the first dielectric material spacer 22L, and a second nanosheet material stack, NS2, located beneath the second sacrificial gate structure 20R and the second dielectric material spacer 22R.

The removal of the physically exposed portions of the semiconductor material stack structure (16/18) that are not protected by first and second sacrificial gate structures (20L, 20R) and the first and second dielectric material spacers (22L, 22R) can be performed utilizing an anisotropic etching process such as, for example, reactive ion etching (RIE). The etching process stops on the strained relaxed silicon germanium alloy buffer layer 14 and the silicon layer 12.

Portions of the semiconductor material stack structure remain beneath the first sacrificial gate structure 20L and the first dielectric material spacer 22L, and portions of the semiconductor material stack structure remain beneath the second sacrificial gate structure 20R and the second dielectric material spacer 22R. The remaining portion of the semiconductor material stack structure that is presented beneath the first sacrificial gate structure 20L and the first dielectric material spacer 22L can be referred to as a first nanosheet material stack, NS1, while the remaining portion of the semiconductor material stack structure that is presented beneath the second sacrificial gate structure 20R and the second dielectric material spacer 22R can be referred to as a second nanosheet material stack, NS2.

The first nanosheet material stack, NS1, includes alternating nanosheets of a remaining portion of each layer of sacrificial semiconductor material 16 (referred to herein as a first sacrificial semiconductor material nanosheet 16L) and a remaining portion of each layer of semiconductor channel material 18 (referred to herein as a first semiconductor channel material nanosheet 18L). Each nanosheet, i.e., first sacrificial semiconductor material nanosheet 16L and first semiconductor channel material nanosheet 18L, that constitutes the first nanosheet material stack, NS1, has a thickness as mentioned above for the individual layers of sacrificial semiconductor material 16 and layers of semiconductor channel material 18 of the semiconductor material stack structure, and a width that is typically greater than 100 nm to 300 nm. At this point of the present application and as illustrated in FIG. 4, the sidewalls of each first sacrificial semiconductor material nanosheet 16L are vertically aligned to sidewalls of each first semiconductor channel material nanosheet 18L. Each first semiconductor channel material nanosheet 18L is tensilely strained due to the presence of the underlying strained relaxed silicon germanium alloy buffer layer 14.

The second nanosheet material stack, NS2, includes alternating nanosheets of a remaining portion of each layer of sacrificial semiconductor material 16 (referred to herein as a second sacrificial semiconductor material nanosheet 16R) and a remaining portion of each layer of semiconductor channel material 18 (referred to herein as a second semiconductor channel material nanosheet 18R). Each nanosheet, i.e., second sacrificial semiconductor material nanosheet 16R and second semiconductor channel material nanosheet 18R, that constitutes the second nanosheet material stack, NS2, has a thickness as mentioned above for the individual layers of sacrificial semiconductor material 16 and layers of semiconductor channel material 18 of the semiconductor material stack structure, and a width that is less than the width of each nanosheet that constitutes the first nanosheet material stack, NS1. In one example, the width of each nanosheet (16R/18R) in the second nanosheet material stack, NS2, is from 10 nm to 50 nm. At this point of the present application and as illustrated in FIG. 4, the sidewalls of each second sacrificial semiconductor material nanosheet 16R are vertically aligned to sidewalls of each second semiconductor channel material nanosheet 18R. Each second semiconductor channel material nanosheet 18R is typically non-strained.

Figure 5:
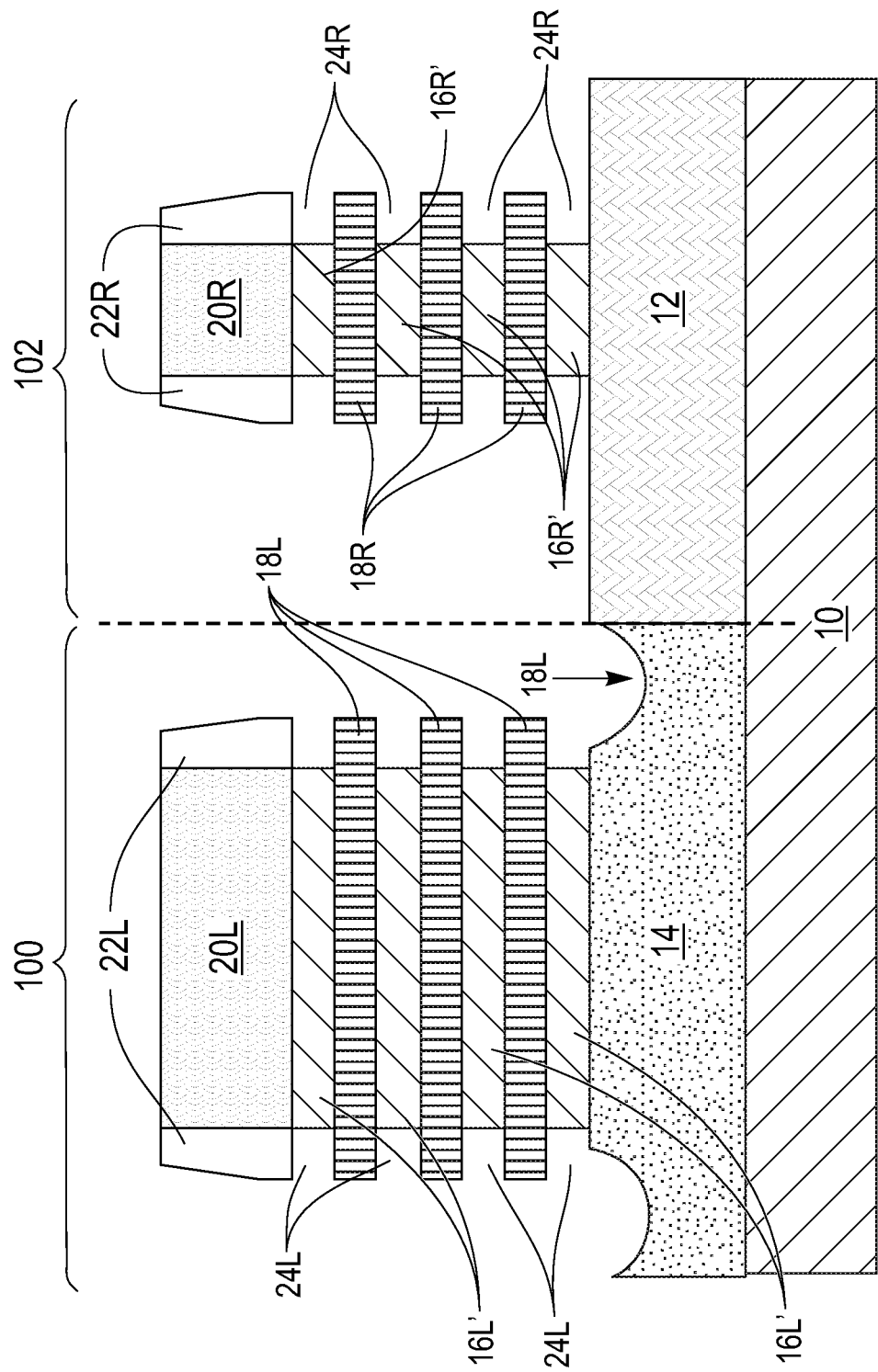
FIG. 5 is a cross sectional view of the exemplary semiconductor structure of FIG. 4 after recessing each sacrificial semiconductor material nanosheet of the first and second nanosheet material stacks.

Referring now to FIG. 5, there is illustrated the exemplary semiconductor structure of FIG. 4 after recessing each sacrificial semiconductor material nanosheet (16L/16R) of the first and second nanosheet material stacks, NS1 and NS2. The recessing of each sacrificial semiconductor material nanosheet (16L/16R) of the first and second nanosheet material stacks, NS1 and NS2, may be performed utilizing a lateral etching process that is selective in removing physically exposed end portions of each sacrificial semiconductor material nanosheet (16L, 16R) relative to each semiconductor channel material nanosheet (18L, 18R).

Each recessed first sacrificial semiconductor material nanosheet, designated as 16L', has a width that is less than the original width of each first sacrificial semiconductor material nanosheet 16L, and each recessed second sacrificial semiconductor material nanosheet, designated as 16R', has a width that is less than the original width of each second sacrificial semiconductor material nanosheet 16R. The recessing of each first sacrificial semiconductor material nanosheet 16L provides a first gap 24L between each neighboring pair of first semiconductor channel material nanosheets 18L in the first nanosheet material stack, NS1, and a first gap 24L is also located beneath the bottommost first semiconductor channel material nanosheet 18L and the strained relaxed silicon germanium alloy buffer layer 14. The recessing of each second sacrificial semiconductor material nanosheet 16R provides a second gap 24R between each neighboring pair of second semiconductor channel material nanosheets 18R in the second nanosheet material stack, NS2, and a second gap 24R is also located beneath the bottommost second semiconductor channel material nanosheet 18R and the silicon layer 12.

In some embodiments, a portion of the strained relaxed silicon germanium alloy buffer layer 14 is removed during this step of the present application. In such an embodiment, a recessed region 26L is formed into the strained relaxed silicon germanium alloy buffer layer 14. The recessed region 26L may have a concave surface as is shown, for example, in FIG. 5.

Figure 6:
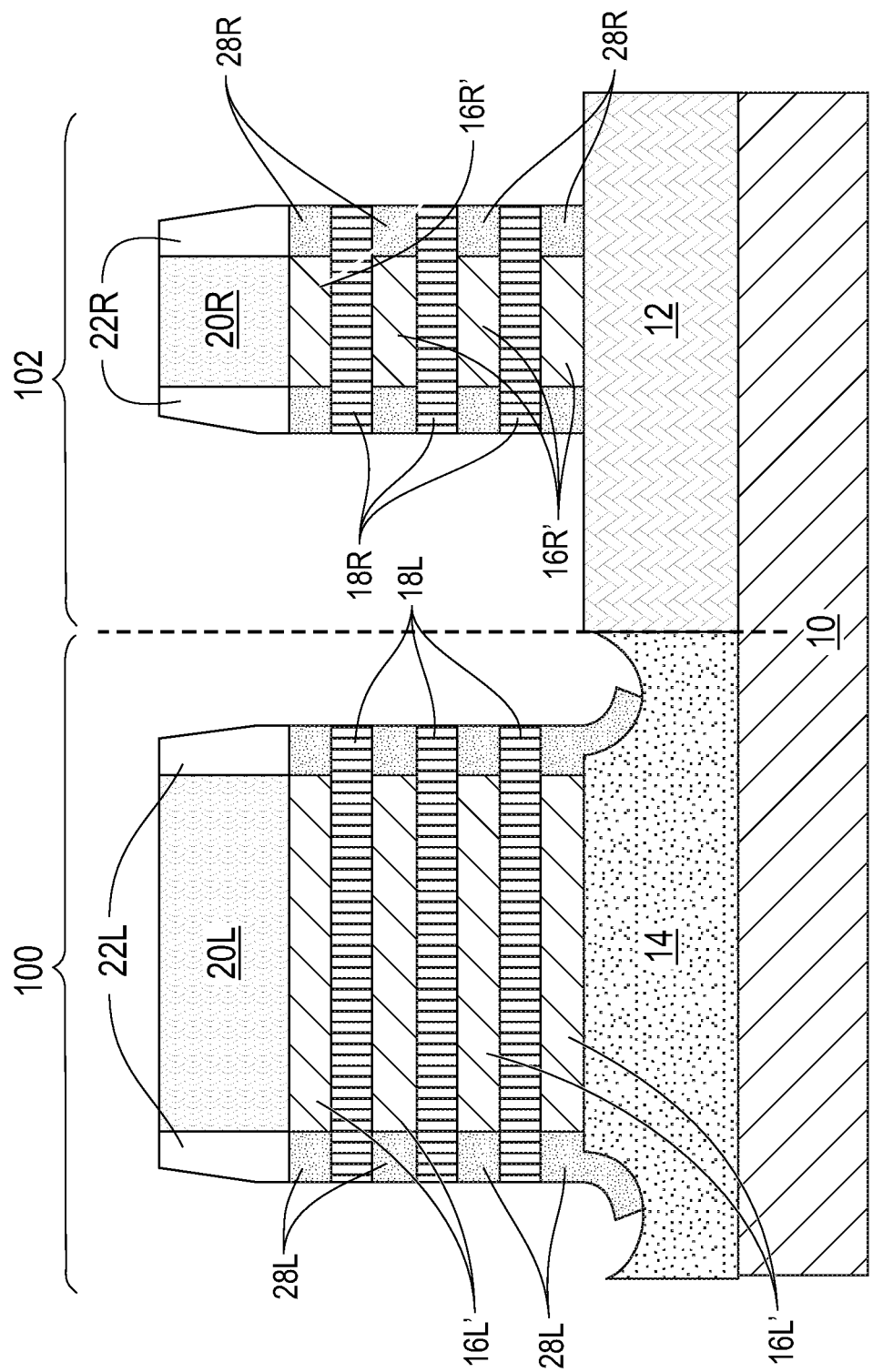
FIG. 6 is a cross sectional view of the exemplary semiconductor structure of FIG. 5 after forming a first inner dielectric spacer on exposed sidewalls of each recessed sacrificial semiconductor material nanosheet of the first nanosheet material stack, and a second inner dielectric spacer on exposed sidewalls of each recessed sacrificial semiconductor material nanosheet of the second nanosheet material stack.

Referring now to FIG. 6, there is illustrated the exemplary semiconductor structure of FIG. 5 after forming a first inner dielectric spacer 28L on exposed sidewalls of each recessed sacrificial semiconductor material nanosheet 16L' of the first nanosheet material stack, NS1, and a second inner dielectric spacer 28R on exposed sidewalls of each recessed sacrificial semiconductor material nanosheet 16R' of the second nanosheet material stack, NS2. In embodiments in which a recessed region 26L is formed into the strained relaxed silicon germanium alloy buffer layer 14, a portion of the bottommost first inner spacer 28L is also formed into the recessed region 26L, as is shown, for example, in FIG. 6. The first and second inner dielectric spacer (28L, 28R) are formed by depositing an inner dielectric spacer material and etching the deposited inner dielectric spacer material. In one example, the inner dielectric spacer material is composed of silicon nitride.

Figure 7:
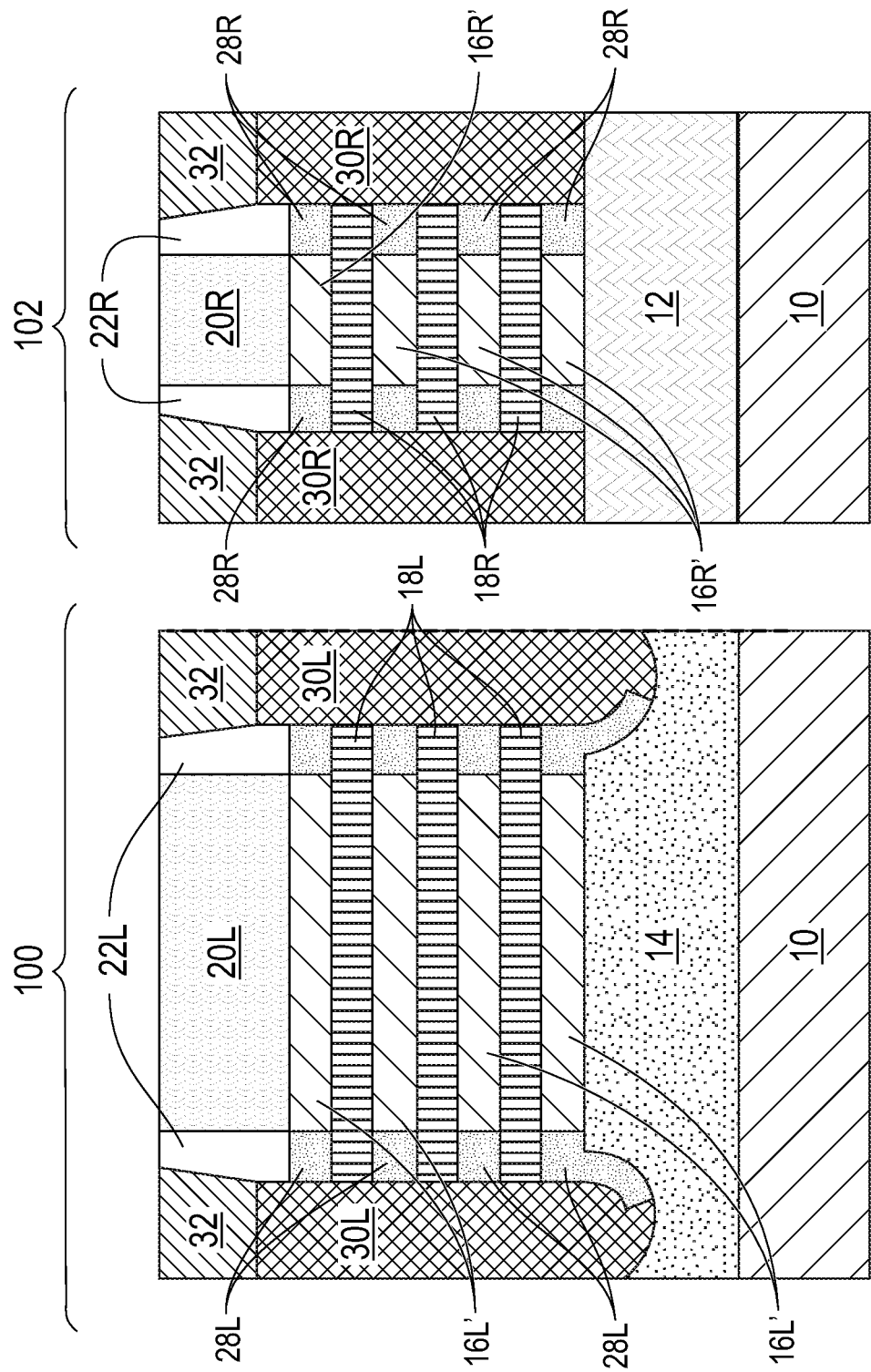
FIG. 7 is a cross sectional view of the exemplary semiconductor structure of FIG. 6 after forming a first source/drain structure on each side of the first nanosheet material stack, and a second source/drain structure on each side of the second nanosheet material stack, and forming an interlayer dielectric (ILD) material layer on the first and second source/drain structures.

Referring now to FIG. 7, there is illustrated the exemplary semiconductor structure of FIG. 6 after forming a first source/drain structure 30L on each side of the first nanosheet material stack, NS1, and a second source/drain structure 30R on each side of the second nanosheet material stack, NS2, and forming an interlayer dielectric (ILD) material layer 32 on the first and second source/drain structures (30L, 30R). It is noted that in FIGS. 7, 8 and 9, the long channel device region 100 and the short channel device region 102 are shown spaced apart from each other but are integrated on a same substrate, i.e., the insulator layer 10. The first source/drain structure 30L is in direct contact with sidewalls of each first semiconductor channel material nanosheet 18L, while the second source/drain structure 30R is in direct physical contact with sidewalls of each second semiconductor channel material nanosheet 18R. In some embodiments, and as is shown in FIG. 7, the first source/drain structures 30L fills in a remaining volume of the recessed region 26L.

The first and second source/drain structures (30L, 30R) include a semiconductor material having semiconducting properties, such as, for example, silicon or a silicon germanium alloy, and a dopant. The first and second source/drain structures (30L, 30R) may be composed of a same or different semiconductor material. The dopant that is present in the first and second source/drain structures (30L, 30R) can be either a p-type dopant or an n-type dopant. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The concentration of dopant within the first and second source/drain structures (30L, 30R) is typically from $5E19$ atoms/cm$^3$ to $3E21$ atoms/cm$^3$.

The first and second source/drain structures (30L, 30R) can be formed utilizing an epitaxial growth process as defined above. In the present application, the first source/drain structure 30L grows laterally outward from the exposed sidewalls of each first semiconductor channel material nanosheet 18L, while the second source/drain structure 30R grows laterally outward from the exposed sidewalls of each second semiconductor channel material nanosheet 18R. In one embodiment, the dopant that can be present in the first and second source/drain structures (30L, 30R) can be introduced into the precursor gas that provides first and second source/drain structures (30L, 30R). In another embodiment, the dopant can be introduced into an intrinsic semiconductor layer by utilizing one of ion implantation or gas phase doping. In one example, each first and second source/drain structures (30L, 30R) comprises a silicon germanium alloy that is doped with a p-type dopant such as, for example, boron.

The ILD material layer 32 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material layer 32. The use of a self-planarizing dielectric material as the ILD material layer 32 may avoid the need to perform a subsequent planarizing step.

In one embodiment, the ILD material layer 32 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material layer 32, a planarization process or an etch back process follows the deposition of the dielectric material that provides the ILD material layer 32. As is shown, the ILD material layer 32 has a topmost surface that is coplanar with a topmost surface of the first and second sacrificial gate structures (20L, 20R), and the first and second dielectric material spacers (22L, 22R).

Figure 8:
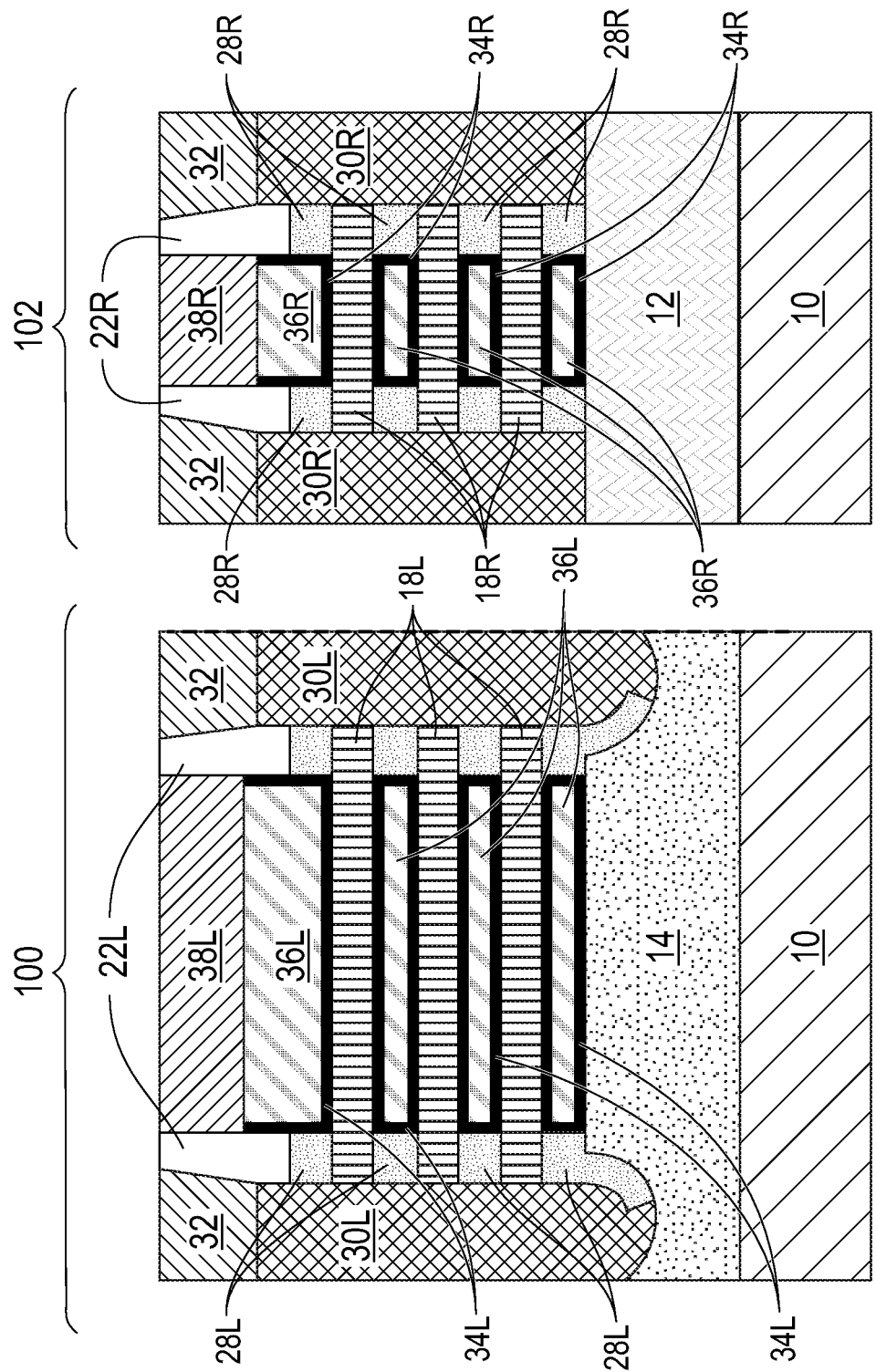
FIG. 8 is a cross sectional view of the exemplary semiconductor structure of FIG. 7 after removing the first and second sacrificial gate structures and each recessed sacrificial semiconductor material nanosheet of the first and second nanosheet material stacks, and forming a first functional gate structure wrapped around each semiconductor channel material nanosheet of the first nanosheet material stack and a second functional gate structure wrapped around each semiconductor channel material nanosheet of the second nanosheet material stack.

Referring now to FIG. 8, there is illustrated the exemplary semiconductor structure of FIG. 7 after removing the first and second sacrificial gate structures (20L, 20R) and each recessed sacrificial semiconductor material nanosheet (16L', 16R') of the first and second nanosheet material stacks (NS1, NS2), and forming a first functional gate structure (34L, 36L) wrapped around each semiconductor channel material nanosheet 18L of the first nanosheet material stack, NS1, and a second functional gate structure (24R, 26R) wrapped around each semiconductor channel material nanosheet 18R of the second nanosheet material stack, NS2. The removal of the recessed sacrificial semiconductor nanosheets (16L', 16R') suspends each of the semiconductor channel material nanosheets (18L, 18R). The suspended first semiconductor channel material nanosheets 18L remain tensilely strained.

The removal first and second sacrificial gate structures 20L, 20R and each recessed sacrificial semiconductor material nanosheet (16L', 16R') of the first and second nanosheet material stacks (NS1, NS2), and the formation of the first and second functional gate structures may be performed simultaneously or at different times.

The removal first and second sacrificial gate structures 20L, 20R may be performed utilizing an anisotropic etching process, such as, for example, reactive ion etching. Each recessed first and second sacrificial semiconductor material nanosheet (16L', 16R') can be removed utilizing an etching process. Suspended first and second semiconductor channel material nanosheets (18L, 18R) are formed.

Each functional gate structures is then formed into a gate cavity and surrounding a physically exposed surface of each semiconductor channel material nanosheet (18L, 18R) of a given nanosheet material stack, i.e., NS1, NS2. By "functional gate structure" it is meant a permanent gate structure used to control output current (i.e., flow of carriers in the channel) of a semiconducting device through electrical or magnetic fields.

The first functional gate structure may include a first gate dielectric portion 34L and a first gate conductor portion 36L The second functional gate structure may include a second gate dielectric portion 34R and a second gate conductor portion 36R. The first and second gate dielectric material portions (34L, 34R) may be composed of a same or different gate dielectric material. The gate dielectric material can be an oxide, nitride, and/or oxynitride. In one example, the gate dielectric material can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion (34L, 34R).

The gate dielectric material can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing can have a thickness in a range from 1 nm to 10 nm. Other thicknesses that are lesser than, or greater than, the aforementioned thickness range can also be employed for the gate dielectric material that may provide the gate dielectric portion (34L, 34R).

The first and second gate conductor portions (36L, 36R) may be composed of a same or different gate conductor material. The gate conductor material can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the first and/or second gate conductor portion (36L, 36R) may comprise an nFET gate metal. In another embodiment, the first and/or second gate conductor portion (36L, 38R) may comprise a pFET gate metal.

The gate conductor material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material can have a thickness from 50 nm to 200 nm. Other thicknesses that are lesser than, or greater than, the aforementioned thickness range can also be employed for the gate conductor material.

The first and second functional gate structures can be formed by providing a functional gate material stack of the gate dielectric material, and the gate conductor material. A planarization process may follow the formation of the functional gate material stack. In some embodiments, the upper portion of the first and second functional gate structures that is positioned between the corresponding spacer dielectric material layer (22L, 22R) is recessed and a gate cap is formed into the recessed area. The gate cap in the long channel device region 100 is referred to herein as a first gate cap 38L, while the gap cap in the short channel device region 102 is referred to herein as a second gate cap 38R. The first and second gate caps (38L, 38R) may include one of the materials mentioned above for the sacrificial dielectric cap. The first and second gate gaps (38L, 38R) may be formed by deposition, followed by a planarization process.

Figure 9:
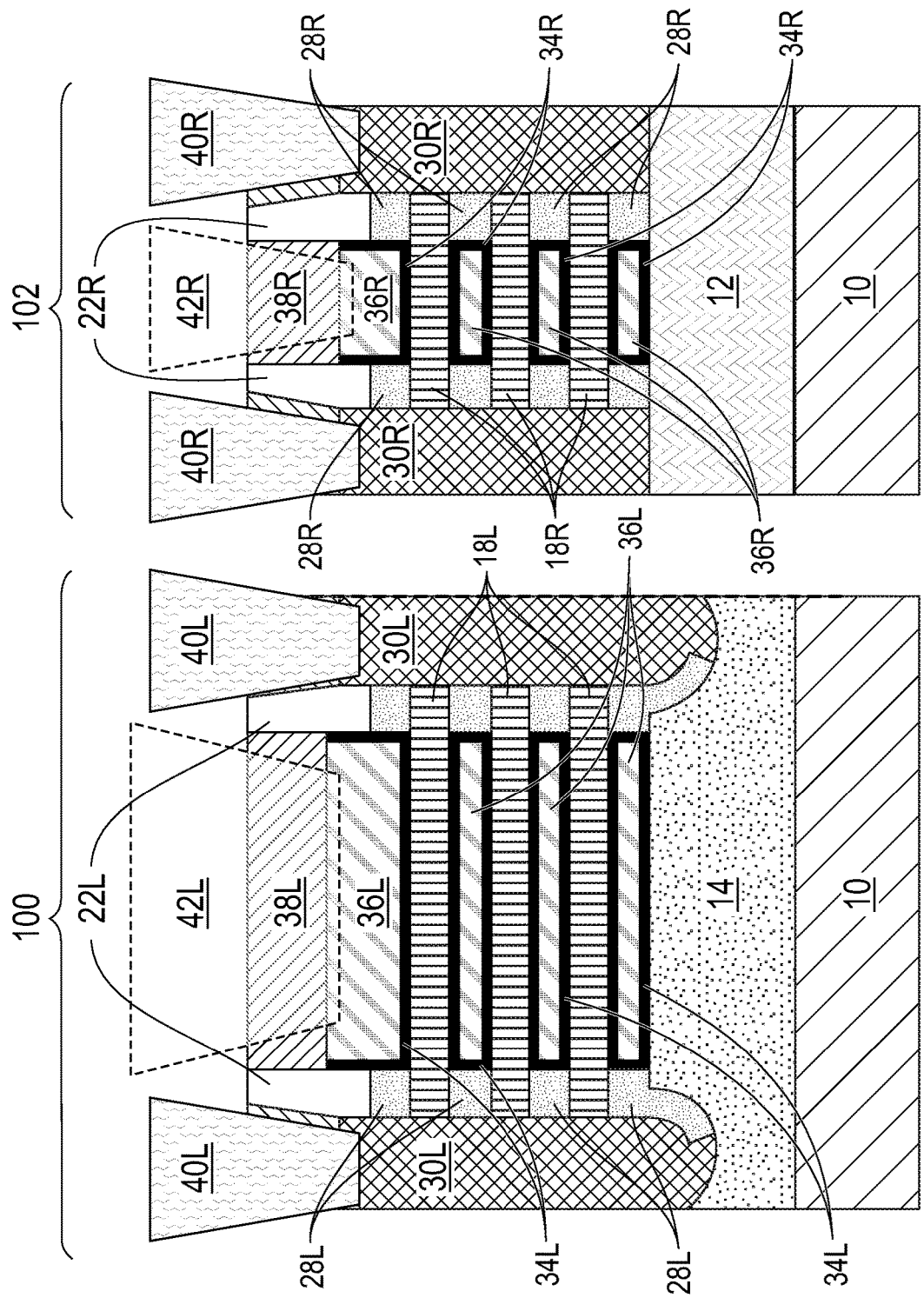
FIG. 9 is a cross sectional view of the exemplary semiconductor structure of FIG. 8 after forming first source/drain contact structures and a first gate contact structure in the long channel device region, and second source/drain contact structures and a second gate contact structure in the short channel device region.

Referring now to FIG. 9, there is illustrated the exemplary semiconductor structure of FIG. 8 after forming first source/drain contact structures 40L and a first gate contact structure 42L in the long channel device region 100, and second source/drain contact structures 40R and a second gate contact structure 42R in the short channel device region 102. It is noted that the first and second gate contact structures(42L, 42R) are formed behind the first and second gate caps (38L, 38R), respectively, thus they are illustrated by dotted lines.

The various contact structures (40L, 40R, 42L, 42R) can be formed by first providing contact openings to expose a conductive region (i.e., the first source/drain structure 30L, the first gate conductor portion 36L, the second source/drain structure 30R, and the second gate conductor portion 36L) of the structure. The contact openings can be formed by lithography and etching. Each contact opening is the filled with a contact metal or metal alloy. Examples of contact metals include, but are not limited to, tungsten (W), aluminum (Al), copper (Cu), or cobalt (Co). An example of a contact metal alloy is Cu—Al alloy. A planarization process may follow the filling of each contact opening with the contact metal or metal alloy.

It is noted that due to the presence of the strained relaxed silicon germanium alloy buffer layer 14 in the long channel device region 100 and, since the first semiconductor channel material nanosheets 18L are tensilely strained, little or no sagging of the first semiconductor channel material nanosheets 18L is observed. Thus, the semiconductor structure of the present application can be used in I/O applications. The reduction and the sagging effect works whether a p-type functional gate structure or an n-type functional gate structure is formed in the long channel device region 100.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a plurality of stacked and suspended semiconductor channel material nanosheets located above a strained relaxed silicon germanium alloy buffer layer and in a long channel device region, wherein each suspended semiconductor channel material nanosheet is tensilely strained and has a channel length of greater than 100 nm;
a functional gate structure wrapping around a portion of each semiconductor channel material nanosheet of the plurality of stacked and suspended semiconductor channel material nanosheets;
a source/drain (S/D) structure on each side of the functional gate structure and physically contacting sidewalls of each semiconductor channel material nanosheet of the plurality of stacked and suspended semiconductor channel material nanosheets; and
an inner dielectric spacer contacting a sidewall of a gate dielectric of the functional gate structure and located above and below an outer portion of each semiconductor channel material nanosheet of the plurality of stacked and suspended semiconductor channel material nanosheets, wherein the strained relaxed silicon germanium alloy buffer layer has a concave surface located on each side of the functional gate structure, and wherein the inner spacer located beneath the bottommost semiconductor channel material nanosheet of the plurality of stacked and suspended semiconductor channel material nanosheets directly contacts a topmost surface of the strained relaxed silicon germanium alloy buffer layer and extends onto, and covers, a portion of the concave surface of the strained relaxed silicon germanium alloy buffer layer.

2. The semiconductor structure of claim 1, further comprising an interlevel dielectric (ILD) material layer located above the source/drain structure.

3. The semiconductor structure of claim 1, wherein the strained relaxed silicon germanium alloy buffer layer has a germanium content from 15 atomic percent to 35 atomic percent, and a strain value of 0.1% or less.

4. The semiconductor structure of claim 1, wherein the strained relaxed silicon germanium alloy buffer layer is located on a surface of an insulator layer.

5. The semiconductor structure of claim 1, wherein the functional gate structure is a p-type functional gate structure.

6. The semiconductor structure of claim 1, wherein the functional gate structure is an n-type functional gate structure.

7. The semiconductor structure of claim 1, further comprising a source/drain contact structure contacting a surface of the source/drain structure, and a gate contact structure contacting a surface of a gate conductor portion of the functional gate structure.

8. The semiconductor structure of claim 1, further comprising;

another plurality of stacked and suspended semiconductor channel material nanosheets located above a silicon layer and in a short channel device region that is located laterally adjacent to the long channel device region, wherein another functional gate structure wraps around a portion of each semiconductor channel material nano sheet of the another plurality of stacked and suspended semiconductor channel material nanosheets, and another source/drain (S/D) structure located on each side of the another functional gate structure and physically contacting sidewalls of each semiconductor channel material nanosheet of the another plurality of stacked and suspended semiconductor channel material nanosheets, and wherein each of the semiconductor channel material nanosheets of the another plurality of stacked and suspended semiconductor channel material nanosheets has a channel length of 100 nm or less.

9. The semiconductor structure of claim 8, wherein each suspended semiconductor channel material nanosheet in the another plurality of stacked and suspended semiconductor channel material nanosheets in non-stressed.

10. The semiconductor structure of claim 8, further comprising a source/drain contact structure contacting a surface of the another source/drain structure, and a gate contact structure contacting a surface of a gate conductor portion of the another functional gate structure.

* * * * *